United States Patent
Patterson

(10) Patent No.: US 8,841,933 B2
(45) Date of Patent: Sep. 23, 2014

(54) INSPECTION TOOL AND METHODOLOGY FOR THREE DIMENSIONAL VOLTAGE CONTRAST INSPECTION

(75) Inventor: Oliver D. Patterson, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 1049 days.

(21) Appl. No.: 12/878,089

(22) Filed: Sep. 9, 2010

(65) Prior Publication Data

US 2012/0062269 A1  Mar. 15, 2012

(51) Int. Cl.
  *G01R 31/02* (2006.01)
  *G01R 31/307* (2006.01)

(52) U.S. Cl.
  CPC .................. *G01R 31/307* (2013.01)
  USPC .................... 324/762.05

(58) Field of Classification Search
  USPC .......... 324/762.05, 500, 537, 754.01, 754.21, 324/754.22, 762.01, 750.23; 382/149; 250/310, 307; 356/237.1
  See application file for complete search history.

(56) References Cited

U.S. PATENT DOCUMENTS

| | | | |
|---|---|---|---|
| 5,030,909 A | | 7/1991 | Blancha et al. |
| 5,578,821 A | | 11/1996 | Meisberger et al. |
| 5,970,167 A | | 10/1999 | Colvin |
| 6,091,249 A | * | 7/2000 | Talbot et al. ............ 324/754.22 |
| 6,252,412 B1 | | 6/2001 | Talbot et al. |
| 6,344,750 B1 | * | 2/2002 | Lo et al. ................... 324/754.22 |
| 6,445,199 B1 | * | 9/2002 | Satya et al. ............. 324/754.21 |
| 6,583,414 B2 | | 6/2003 | Nozoe et al. |
| 6,771,806 B1 | | 8/2004 | Satya et al. |
| 6,844,550 B1 | | 1/2005 | Yin et al. |
| 7,071,468 B2 | | 7/2006 | Miyai et al. |
| 7,211,797 B2 | | 5/2007 | Nishiyama et al. |
| 2005/0224963 A1 | * | 10/2005 | Whitefield ..................... 257/724 |
| 2007/0222470 A1 | | 9/2007 | Patterson et al. |
| 2008/0251718 A1 | | 10/2008 | Kaga et al. |
| 2009/0017564 A1 | * | 1/2009 | Ramappa ......................... 438/14 |
| 2009/0058437 A1 | * | 3/2009 | Honda et al. ................... 324/751 |
| 2009/0096461 A1 | | 4/2009 | Ahsan et al. |
| 2010/0320381 A1 | * | 12/2010 | Zhao ............................. 250/307 |

FOREIGN PATENT DOCUMENTS

JP  2000-164661  6/2000

OTHER PUBLICATIONS

Hiroi, T.; Okuda, H.; Robust Defect Detection System Using Double Reference Image Averaging for High Throughput SEM Inspection Tool; Advanced Semiconductor Manufacturing Conference, 2006. ASMC 2006. The 17th Annual SEMI/IEEE; May 22-24, 2006 pp. 347-352.

* cited by examiner

*Primary Examiner* — Patrick Assouad
*Assistant Examiner* — Demetrius Pretlow
(74) *Attorney, Agent, or Firm* — Howard M. Cohn; Ian D. MacKinnon; William H. Steinberg

(57) ABSTRACT

A system and method for improved voltage contrast inspection is disclosed. In one embodiment the temporal response to voltage contrast is considered to find an optimal acquisition time. In another embodiment, multiple optimal acquisition times are identified. The identified acquisition times are used in voltage contrast inspection of semiconductor fabrication, and are well-suited to SOI technology.

12 Claims, 6 Drawing Sheets bad

Type 2B

INSPECTION TOOL AND METHODOLOGY FOR THREE DIMENSIONAL VOLTAGE CONTRAST INSPECTION

FIELD OF THE INVENTION

The present invention relates generally to semiconductor fabrication, and more particularly, to detecting defects using voltage contrast inspection.

BACKGROUND OF THE INVENTION

In-line voltage contrast (VC) inspection is a powerful technique for detecting and isolating yield limiting defects in the semiconductor fabricating industry. In-line VC inspection includes scanning the wafer surface of a NFET device in which test structures exist with a scanning electron microscope (SEM). As the inspection proceeds, the SEM induces charge on all electrically floating elements whereas any grounded elements remain at zero potential. This potential difference is visible to the SEM.

Many key defect types may be detected because their existence changes the electrical nature of the electrical nodes they contact. Most of the key applications for VC inspection involve defects that dramatically change the grounding of these nodes. For instance, with a bulk silicon technology, under the typical electron extracting conditions, an open contact on the source or drain (S/D) of a PFET has 3 to 6 magnitudes less capacitance and leakage resistance than a good contact. That is because the good contact draws electrons from the P+S/D region as well as the N well underneath.

However, to date, VC contrast inspection has been much less effective for defects which only marginally change the capacitance and leakage resistance of the structure they reside on. For instance, consider a contact on SOI (silicon on insulator) material as opposed to a bulk technology. In this case, the good contact draws upon electrons from itself as well as the small S/D region it contacts. If a contact is open, then the electrical node is reduced to the top half of the contact. The difference in capacitance and leakage resistance between the good and bad contact may only be a factor of 2 or 3. As the use of SOI technology increases, and feature size continues to reduce, it is becoming more challenging to detect defects of this type. Therefore, an improved tool and methodology for voltage contrast inspection is desirable.

BRIEF SUMMARY

In one embodiment of the present invention, a method for performing voltage contrast inspection is provided, comprising the steps of: acquiring a plurality of voltage contrast images at least one location on a wafer, each voltage contrast image corresponding to a different acquisition time; computing a number of defects for each voltage contrast image, wherein each defect has an associated defect signal; recording the acquisition time that the defect signal for each defect is the strongest, computing the acquisition time which detects the most defects for the at least one location on a wafer; and generating a voltage contrast inspection configuration.

In another embodiment of the present invention a system for performing voltage contrast inspection is provided, comprising: An electron microscope, the electron microscope configured and disposed to acquire a plurality of voltage contrast images, each voltage contrast image corresponding to a different acquisition time; an image analysis module, the image analysis module comprising a central processing unit, and non-transitory storage containing instructions that when executed, computes a number of defect counts in each voltage contrast image, thereby establishing a number of defect counts corresponding to each acquisition time, and subsequently generates a voltage contrast inspection configuration.

In another embodiment of the present invention, a system for performing voltage contrast inspection is provided, comprising: an electron microscope, the electron microscope configured and disposed to acquire a plurality of uncompressed voltage contrast images at multiple contiguous locations on a die within a wafer, and multiple die within a wafer, each voltage contrast image corresponding to a different acquisition time; a frame memory, the frame memory configured and disposed to receive and store a plurality of uncompressed voltage contrast images from the scanning electron microscope; and an image analysis module, the image analysis module comprising a central processing unit, and non-transistory storage containing instructions that when executed, computes a number of defect counts in each voltage contrast image, thereby establishing a number of defect counts corresponding to each acquisition time, and subsequently generates a voltage contrast inspection configuration.

GLOSSARY

SEM—Scanning Electron Microscope, a tool used to induce charge in the test structures, and perform imaging on those test structure.

Voltage Contrast—A phenomenon during SEM imaging where the brightness of an electrical node is proportional to its voltage.

Voltage Contrast Inspection—The technique of scanning a semiconductor surface with a SEM with conditions that induced voltages on each electrical element depending on the capacitance and resistance to a ground. The purpose is to detect electrical abnormalities in the semiconductor.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows a chart indicating voltage characteristics for a bulk technology device.

FIG. 2 shows a chart indicating voltage characteristics for SOI technology device.

FIG. 3 is a flowchart showing process steps for computing the wafer Optimal Voltage Contrast Acquisition (OVA) time.

FIG. 4 shows an example of an interval chart.

FIG. 5 shows a chart indicating voltage characteristics over time for a SOI (silicon-on-insulator) technology device.

FIG. 6 shows an additional example of an interval chart.

FIG. 7 shows an example of a composite defect map.

FIGS. 8-9 show various contact types.

FIG. 10 is a system block diagram of a voltage contrast inspection system in accordance with an embodiment of the present invention.

DETAILED DESCRIPTION

Figure 1:
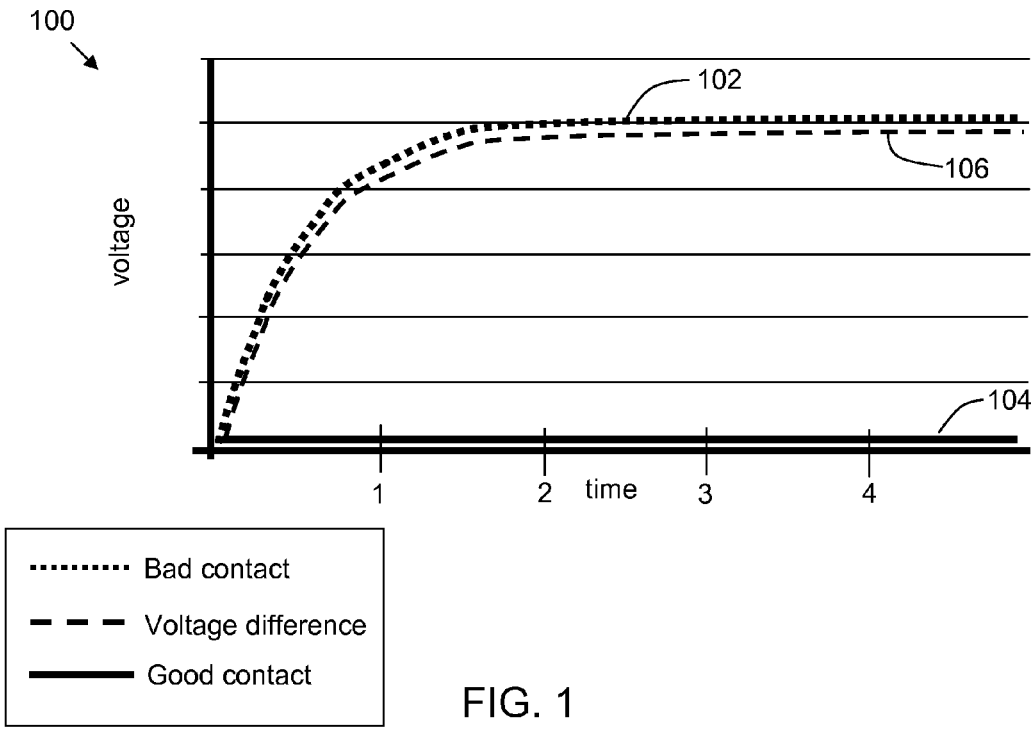

To better appreciate embodiments of the present invention, voltage contrast characteristics will be briefly discussed. FIG. 1 shows a chart 100 indicating voltage characteristics over time for a bulk technology device. Voltage contrast techniques are used to compare a bad contact with a good contact. A bad contact is a contact that is not making a proper electrical connection to its intended connection point, essentially creating an open circuit. A good contact is a contact that is making a proper electrical connection to its intended connection point. Three curves are plotted on chart 100. Curve 102 is the voltage response of a bad contact over time. Curve 104 is the voltage response of a good contact over time. Curve 106 is the voltage difference between curve 102 and curve 104. The units of time and voltage are arbitrary for the purposes of this discussion. Once time advances past the first time marker, the voltage difference remains constant, and is relatively large. The relatively large voltage difference between the good contact and bad contact creates the voltage contrast that allows identification of the bad contact. Areas of higher voltage reflect fewer electrons than areas of lower voltage when electrons from a scanning electron microscope (SEM) are aimed at a wafer, under electron retarding conditions which are typically used. This results in images where dark areas represent areas of higher voltage. If a dark area appears on a particular wafer in an area where it is expected to be light, that represents an area where an element (such as a contact) is supposed to be grounded, but is instead floating, hence is a defective site. In the case of a contact inspection for bulk technology, the voltage response is fairly simple, and a voltage contrast reading any time after time 1 yields a consistent result.

Figure 2:
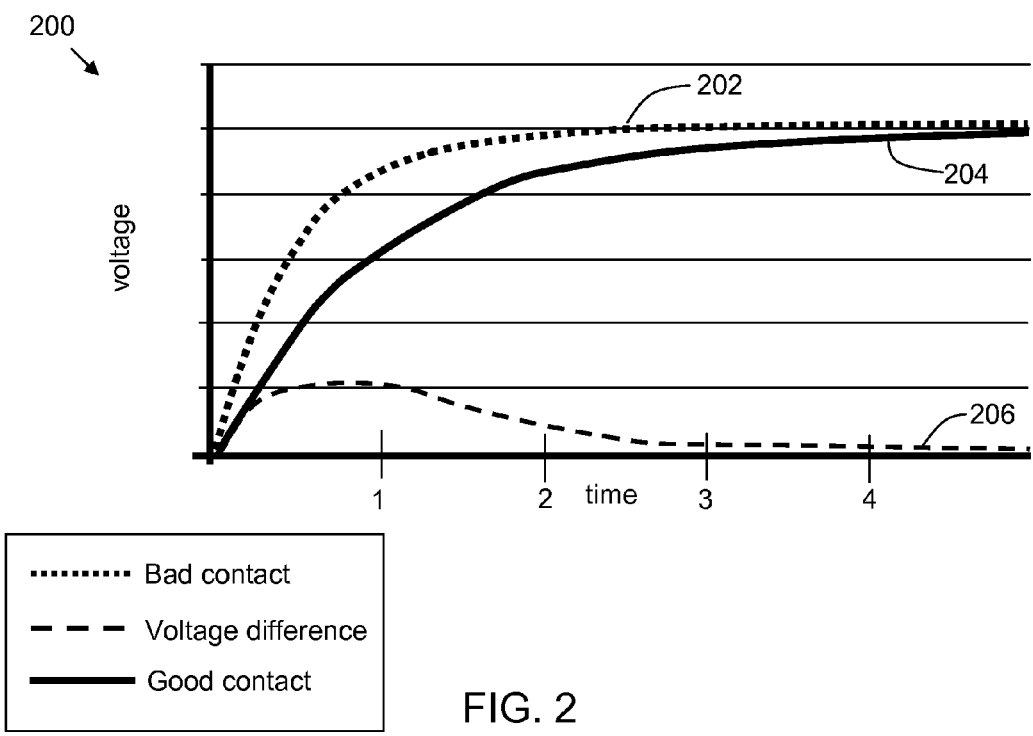

FIG. 2 shows a chart 200 indicating voltage characteristics over time for a SOI (silicon-on-insulator) technology device. Similar to FIG. 1, Curve 202 is the voltage response of a bad contact over time. Curve 204 is the voltage response of a good contact over time. Curve 206 is the voltage difference between curve 202 and curve 204. A difference between the characteristics of bulk technology devices and SOI technology devices pertains to the voltage response over time. In the case of SOI technology, a good contact (see curve 204) builds up voltage over time which is similar to that of a bad contact (see curve 202). However, the voltage response time for good and bad contacts differs. As seen with curve 206, which is the difference in voltage between good and bad contacts, at time interval 1, there is a larger difference between the good and bad contacts than at time interval 3 or 4. The OVA time is the Optimal Voltage Contrast Acquisition Time, which is the acquisition time where the voltage difference (curve 206) is greatest. The curve 206 indicates that the OVA time is at time 1.

Each location (area covered by one voltage contrast image) within a wafer has its own OVA time, referred to as a local OVA time, which is the time where the defect signal is strongest for a particular location having an "open" defect as compared to a good sample having a proper connection between a contact and its underlying substrate. Each voltage contrast image typically has a field of view that is considerably smaller than the size of a wafer. For example, in one embodiment, size of a voltage contrast image is 2000×2000 pixels, which corresponds to an image size on the order of micrometers or less. Therefore, to inspect a larger area, multiple voltage contrast images are acquired at different positions to cover a desired area. In the maximum case, an entire wafer is inspected. However, in other cases, the desired inspection area is less than the entire wafer area, but larger than the area covered by a single voltage contrast image. The "wafer OVA time" represents the best OVA time for this larger area, which may comprise the entire wafer, or a portion of the wafer that is larger than the area covered by a single voltage contrast image. For the purposes of this disclosure, the "wafer OVA time" refers to the OVA time for inspection of this larger area, even if that larger area is less than the entire wafer. A "large portion" of a wafer refers to an inspection area that is larger than the area covered by one voltage contrast image, and is inspected by acquiring voltage contrast inspection images at multiple contiguous locations on a die, and multiple die within a wafer.

Figure 3:
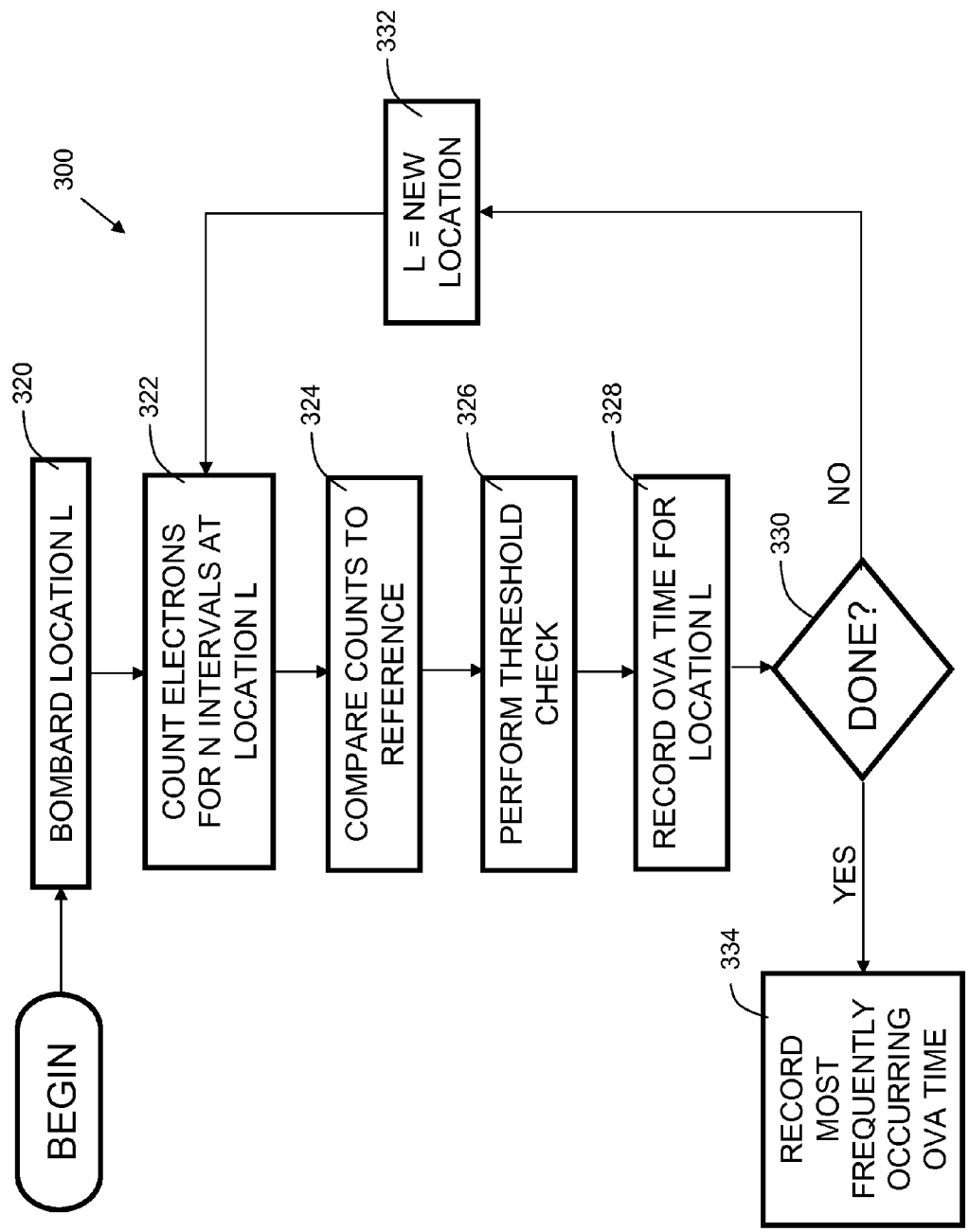

The OVA time for a given wafer (or large portion) can be determined empirically by analyzing a wafer with defects at a plurality of times to find the wafer OVA time, which is the time interval that yields the most defects for the wafer. FIG. 3 is a flowchart 300 showing process steps of a method for computing the wafer OVA time. In process step 320, a particular location L is bombarded with an electron beam. The source of the electron beam may be a scanning electron microscope or other suitable device. In process step 322, a count of electrons reflected back to the electron detector of the electron microscope for N acquisition time intervals is performed. At the same time, the electrons are counted at a reference location corresponding to location L. These values are compared in step 324. For example, in a case where N=5, the difference in electrons may be counted at the following time intervals:

| N | Time Interval | Difference in electrons |
|---|---|---|
| 1 | 0-10 nanoseconds | 101 |
| 2 | 10-20 nanoseconds | 242 |
| 3 | 20-30 nanoseconds | 91 |
| 4 | 30-40 nanoseconds | 41 |
| 5 | 40-50 nanoseconds | 36 |

Upon completion of process step 324, the difference values are then compared with a threshold value in process step 326. If the count value is less than the threshold, it not considered as a defect. In this example, the threshold is 100 counts. Hence, intervals N=3, N=4, and N=5 do not have sufficient counts to be considered as defects.

Considering intervals N=1 and N=2, both exceed the threshold of 100 and hence, intervals N=1 and N=2 both are recorded as showing a defect at location L. Next, in step 328, the location L local OVA time (Defect OVA time) is determined and recorded. In this example, N=2 has the strongest defect signal, that is, the highest difference in electrons, with 242, and hence, the local OVA time is N=2 (the second time interval). In process step 330, a check is made to determine if there is another location of the wafer to check. If so, a new location is set in process step 332, and the inspection process repeats. Location L corresponds to a pixel within an image generated by the scanning electron microscope or other imaging device. Typical inspection tools inspect at a rate of 200 Mhz and a typical inspection time is about an hour. Hence this algorithm may typically be executed billions of times.

If there are no more locations to analyze, then the inspection process is completed. The most frequently occurring local OVA time is recorded at step 334, and represents the Wafer OVA time, which is the time that will be used during in-process inspection. The Wafer OVA time is the time where the overall voltage difference between a good contact and bad contact is maximized, and thus is a time well-suited for voltage contrast inspection.

Figure 4:
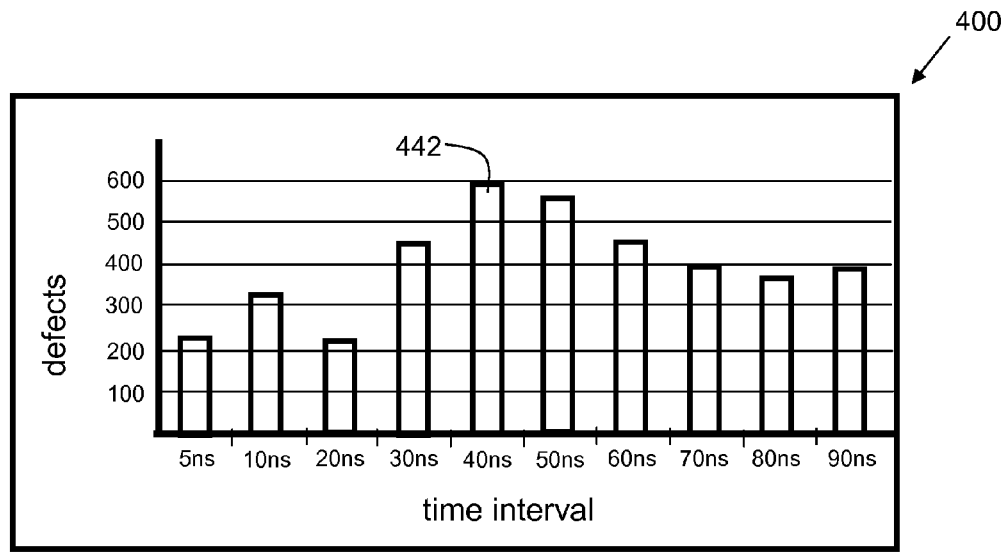

FIG. 4 shows an example of an interval chart 400, which results from the process of computing the wafer OVA time outlined in FIG. 3. The interval chart 400 shows a temporal distribution of defect counts, and provides a user, such as a process engineer, a graphical indication of the time interval that resulted in the optical detection of the most defects. In an alternative embodiment, the wafer OVA time is defined as the interval in which the highest number of defects is detected over the entire wafer (as compared to the wafer OVA time discussed in FIG. 3, which is based on the most frequently occurring local OVA time). In one embodiment, a system provides a user-selectable option to determine how the Wafer OVA time is derived. Referring again to interval chart 400, the interval at 40 nanoseconds, indicated as bar 442, shows the maximum number of defects, and therefore is the OVA time for the wafer. This method allows a user to optimize the voltage contrast inspection time for the particular wafer such as the case illustrated in FIG. 2. Other defects of interest may have a different OVA time, depending on the materials and geometries of the features of interest and the nature of the defects affecting them. In the example of FIG. 4, it can now be seen that using a time interval of 40 nanoseconds is the most effective for voltage contrast inspection for the selected beam conditions.

Figure 5:
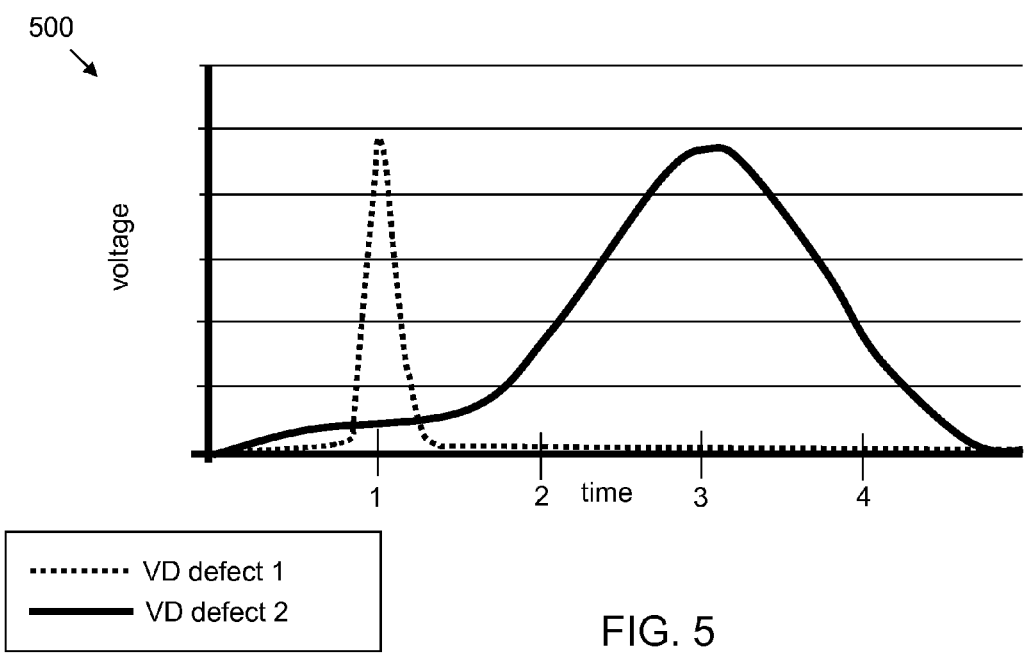

FIG. 5 shows a chart 500 indicating voltage characteristics over time for a SOI (silicon-on-insulator) technology device. In this chart, the voltage difference (VD) is graphed for two types of defects that are present on a SOI technology device. Note that defect 1 has a peak in voltage difference (the difference between a good and bad contact) at time interval 1, and defect 2 has a peak in voltage difference at time interval 3. Furthermore, at time interval 3, it is very difficult to detect defects of type 1, since the voltage difference is so low that little voltage contrast is available at time interval 3 for defect 1. Hence, in this case, no single wafer OVA time adequately evaluates the defects. In an alternate embodiment of the present invention, a multiple wafer OVA time approach is used. In one embodiment, voltage contrast analysis is performed at two distinct time intervals, as to capture multiple defect types. In the case of FIG. 5, a multiple wafer OVA time approach may use both interval 1 and interval 3, allowing both types of defects to be characterized by a voltage contrast inspection technique.

Figure 6:
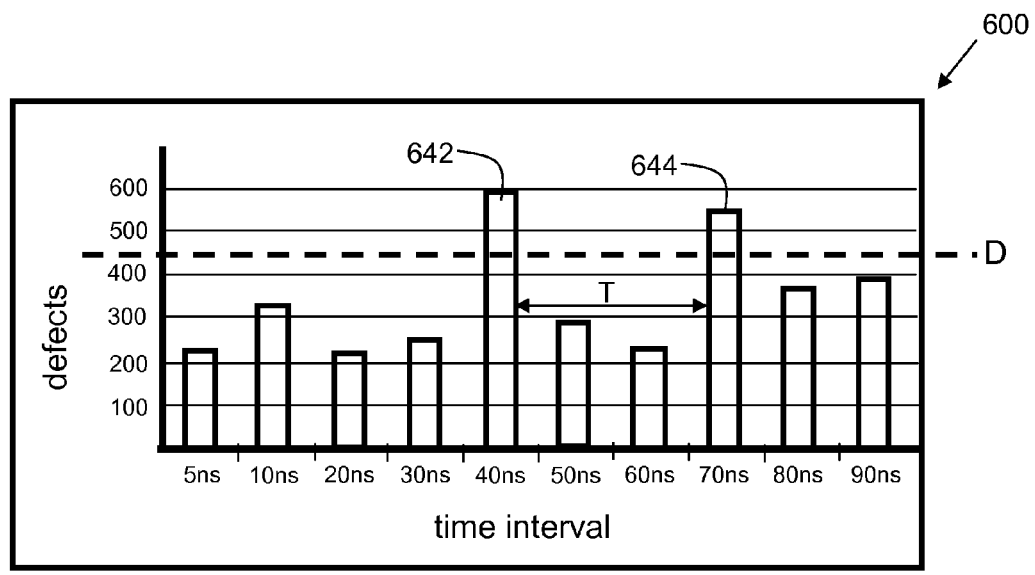

FIG. 6 shows a second example of an interval chart 600. This interval chart shows two peak bars 642 and 644. Peak bars 642 and 644 exceed defect threshold D and are separated by a time span T. Two peak bars that satisfy the condition of exceeding a defect threshold and separation exceeding a predetermined time interval indicate that the wafer is a candidate for a multiple OVA time inspection process. In the example shown in FIG. 6, D=450, and the predetermined time interval is 20 ns. As bars 642 and 644 both exceed defect threshold D, and time span T is 30 ns, exceeding the 20 ns predetermined time interval, the bars 642 and 644 are candidates for a multiple OVA time approach. As can be seen in interval chart 600, a considerable number of defects are detectable at both the 40 ns interval and the 70 ns interval, hence OVA(1)=40 ns and OVA(2)=70 ns. The 40 nanosecond acquisition time and 70 nanosecond acquisition time are then both used to acquire data via voltage contrast inspection for this particular semiconductor design. A voltage contrast inspection configuration contains the number of acquisition times to be used, as well as the values of those times. The voltage contrast inspection configuration is part of an inspection "recipe." In this case, the voltage contrast inspection configuration comprises the value 2, for two acquisition times, and also the values of those times (40 ns and 70 ns).

Figure 7:
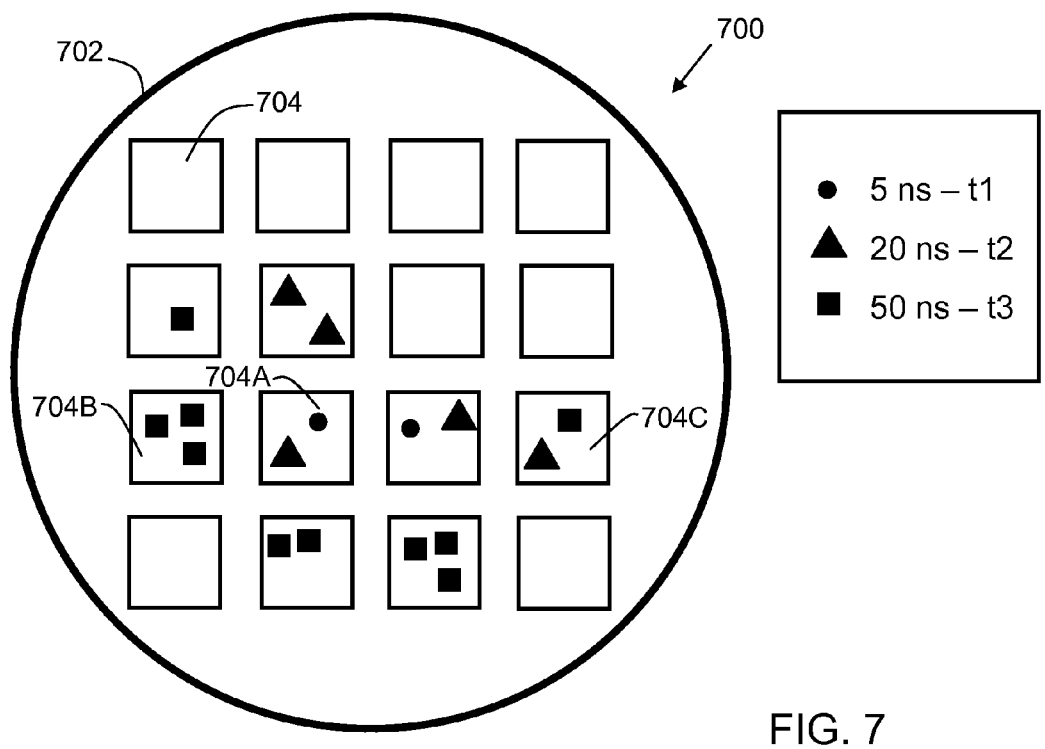

FIG. 7 shows an additional graphical representation of a multiple voltage contrast time analysis, called a composite defect map, indicated as 700. In this example, 3 times are used, time t1 is 5 nanoseconds, time t2 is 20 nanoseconds, and time t3 is 50 nanoseconds. In the composite defect map 700, defects found at various acquisition times are indicated with different symbols (marks). Defects found at time t1 are indicated with a circle symbol, defects found at time t2 are indicated with a triangle symbol, and defects at time t3 are indicated with a square symbol. In another embodiment, various colored marks may be used instead of or in addition to using a different shape. For example, t1 defects are displayed as red marks, t2 defects displayed as brown marks, and so on.

The composite defect map 700 is comprised of a representation of a wafer 702, and the various die within each wafer, indicated generally as 704. The defect symbols are positioned in the approximate X-Y location of the wafer where they are found. Note that some defect types tend to have a wafer spatial pattern, showing up predominantly along the edges of the wafer, or in the center of the wafer. In the example of FIG. 7, the defects found at t3 tend to be located more along the edges of the wafer (indicated as squares), and the defects found at t1 tend to be located towards the middle of the wafer. For example, die 704A has a defect found during t1 and during t2. Die 704B has defects found at t3, and die 704C has defects found at t2 and t3.

Figure 8:
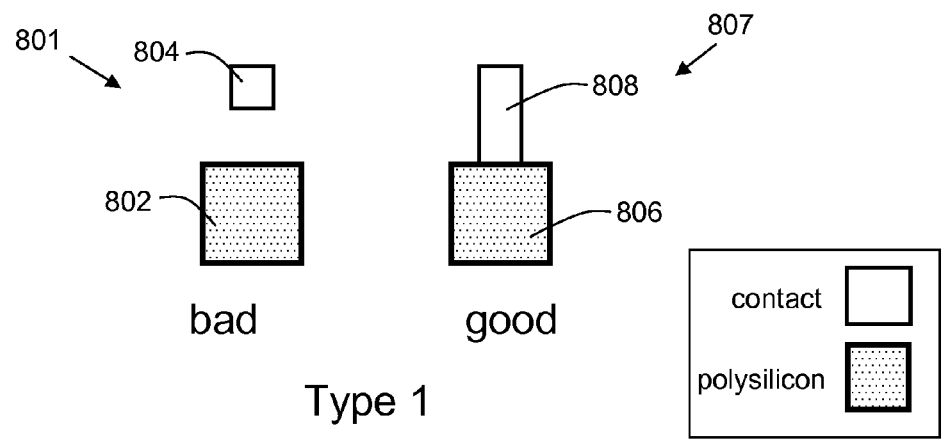

FIG. 8 shows an example of type 1 contacts. Contact 801 is a bad contact and contact 807 is a good contact. For contact 801, metal region 804 does not contact polysilicon region 802 even though it is supposed to. That causes metal region 804 to have a higher voltage when bombarded with electrons than good contact 807. For good contact 807, metal region 808 contacts polysilicon region 806 as it should, giving it different a voltage response than the bad contact 801.

Figure 9A:
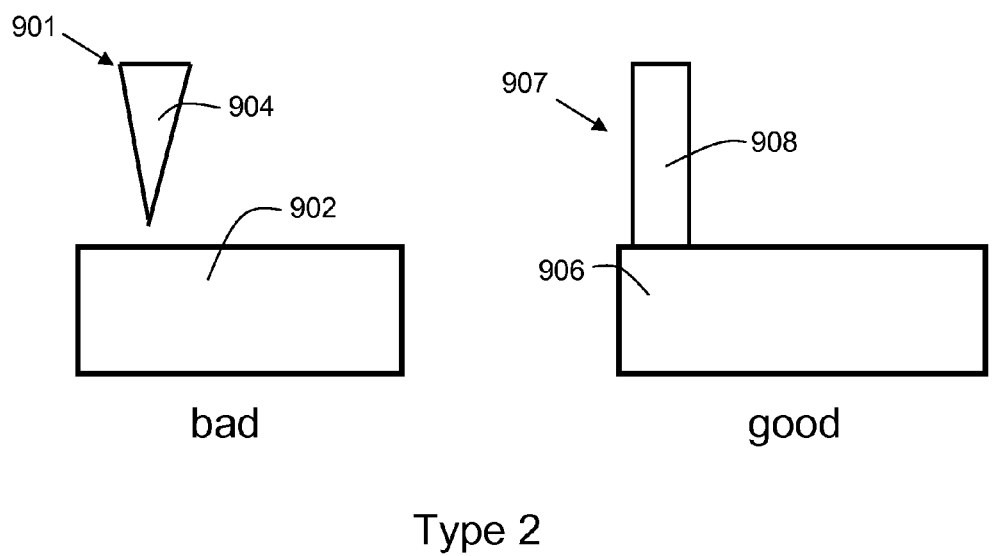

FIG. 9A shows an example of type 2 contacts. Contact 901 is a bad contact and contact 907 is a good contact. For contact 901, metal region 904 does not contact silicon active area 902 even though it is supposed to. That causes metal region 904 to have a higher voltage when bombarded with electrons than good contact 907. For good contact 907, metal region 908 contacts silicon active area region 906 as it should, giving it a different voltage response than the bad contact 901.

Figure 9B:
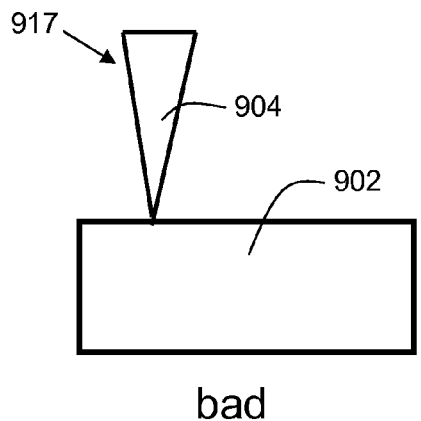

FIG. 9B shows another example of a bad contact 917, referred to as a type 2B contact. In the case of contact 917, metal region 904 is making a partial connection to active area 902, and is considered as a "resistive open." Hence, it will have a lower voltage than contact 901 (FIG. 9A) upon bombardment with electrons from a SEM. However, the voltage response of contact 917 is different than that of contact 907 (FIG. 9A), and hence inspections looking for both bad type 1 and type 2 contacts may be a candidate for use of a multiple voltage contract inspection time approach.

Figure 10:
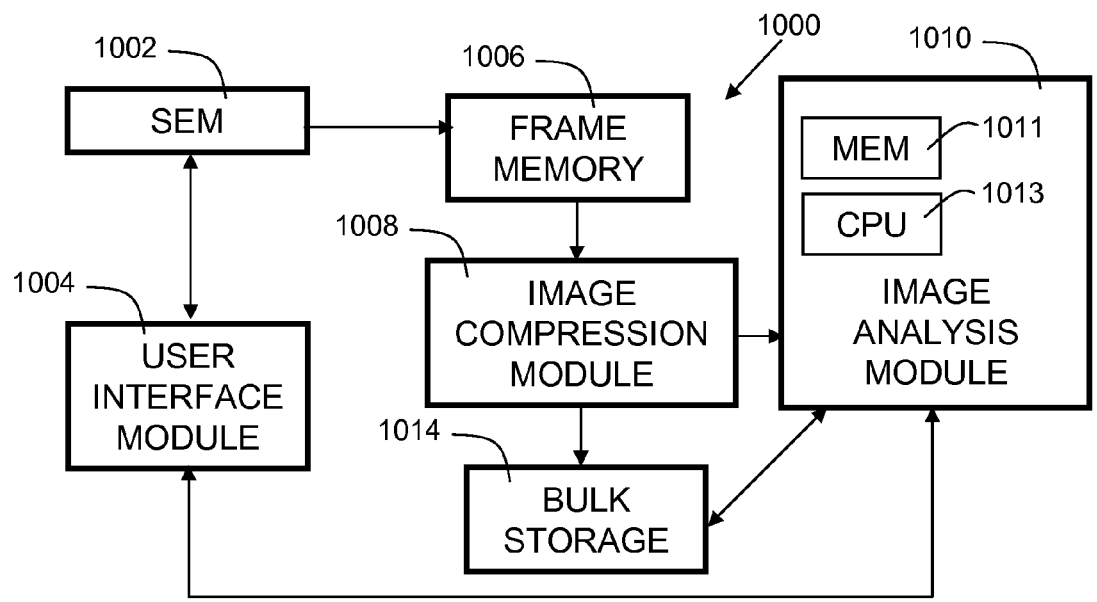

FIG. 10 is a system block diagram of a voltage contrast inspection system 1000 in accordance with an embodiment of the present invention. System 1000 comprises scanning electron microscope (SEM) 1002 which is configured and disposed to bombard all or part of a wafer with electrons, and record the number of electrons reflected into an electron detector. The SEM then generates a 2 dimensional voltage contrast image for the area of the wafer undergoing inspection and sends it to frame memory 1006. Frame memory 1006 is a RAM (Random Access Memory) array that stores an uncompressed voltage contrast image. In one embodiment, Frame Memory 1006 is sufficiently large to hold multiple uncompressed frames (a frame may comprise one or more contiguous voltage contrast images). Uncompressed frames are retrieved from frame memory 1006 by image compression module 1008. Image compression module 1008 may comprise one or more microprocessors executing machine instructions on computer readable media to perform an image compression of the uncompressed frames. In one embodiment, the image compression module 1008 utilizes one or more of the following compression schemes, MPEG-2, MPEG-4, JPEG, and JPEG2000. Other image compression schemes may also be used. The compressed images are stored in bulk storage module 1014 which may comprise RAM, Flash, a hard disk, or other suitable storage technology. Compressed images stored in bulk storage module 1014 are then retrieved by image analysis module 1010. Image analysis module 1010 comprises central processing unit 1013 and memory 1011. Once the compressed images are received by image analysis module 1010, they are decompressed, and then analyzed to determine statistics such as the number of defects on the wafer, the number of defects detected in each time interval, and a spatial relationship of each error (e.g. edge, or center) within the wafer. Other analysis may include determination of a single wafer OVA time, and determining if a multiple wafer OVA time approach is more appropriate, for example, by using the approach outlined in the discussion of FIG. 6. User interface module 1004 comprises controls for creating, editing, and viewing voltage contrast inspection configurations. User interface module 1004 may further comprise a display, in which voltage contrast images are sequentially displayed in order from shortest acquisition time to longest acquisition time. By displaying the images sequentially, either rapidly (like a movie) or slowly (like a time-lapse mode), a visual indication of the most effective acquisition times for the wafer can be quickly identified by a user.

As can now be appreciated, embodiments of the present invention provide the ability to conduct efficient voltage contrast testing on SOI technology wafers. Using the system and methods described herein, the types of defects able to be analyzed is expanded by the calculated selection of one or more optimal voltage contrast times to be used for acquiring voltage contrast images.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for performing voltage contrast inspection, comprising:

acquiring a plurality of voltage contrast images at at least one location on a wafer, each voltage contrast image corresponding to a different acquisition time;

computing a number of defects for each voltage contrast image, wherein each defect has an associated defect signal;

recording the acquisition time that the defect signal for each defect is the strongest, computing the acquisition time which detects the most defects for said at least one location on a wafer; and generating a voltage contrast inspection configuration, wherein the voltage contrast inspection configuration comprises at least one wafer optimal voltage contrast acquisition time (OVA) time which is the OVA time for inspection of the at least one location on the wafer.

2. The method of claim 1, further comprising the step of generating a graphical representation of a temporal distribution of defect counts.

3. The method of claim 1, wherein the step of generating a voltage contrast inspection configuration comprises identifying a single wafer OVA time to be used for voltage contrast inspection.

4. The method of claim 1, wherein the step of generating a voltage contrast inspection configuration comprises identifying multiple wafer OVA times to be used for voltage contrast inspection.

5. The method of claim 4, wherein the step of generating a voltage contrast inspection configuration comprises identifying two wafer OVA times.

6. The method of claim 5, wherein the step of identifying two wafer OVA times comprises:

identifying a first acquisition time corresponding to the highest number of defect counts;

identifying a second acquisition time corresponding to the second highest number of defect counts;

computing a time span between the first acquisition time and the second acquisition time; and generating a voltage contrast inspection configuration comprising the first acquisition time and the second acquisition time if the time span exceeds a predetermined time interval.

7. The method of claim 6, further comprising the step of comparing second highest number of defect counts to a defect threshold and generating a voltage contrast inspection configuration comprising the first acquisition time and the second acquisition time when the defect counts of the second highest number of defects exceeds the defect threshold.

8. The method of claim 2, wherein the step of generating a graphical representation of the temporal distribution of defect counts comprises generating an interval chart.

9. The method of claim 2, wherein the step of generating a graphical representation of the temporal distribution of defect counts comprises generating a composite defect map.

10. The method of claim 9, wherein the step of generating a composite defect map comprises indicating defects corresponding to particular wafer locations with a symbol, wherein a different symbol is used for each different acquisition time.

11. The method of claim 9, wherein the step of generating a composite defect map comprises indicating defects corresponding to particular wafer locations with a colored mark, wherein a different color is used for each different acquisition time.

12. The method of claim 9, further comprising the step of sequentially presenting voltage contrast images via a user interface module, wherein the voltage contrast images are displayed in order from shortest acquisition time to longest acquisition time.

* * * * *